US011175330B2

(12) United States Patent
Reitz

(10) Patent No.: US 11,175,330 B2
(45) Date of Patent: Nov. 16, 2021

(54) ELECTRIC CIRCUIT ARRANGEMENT AND METHOD FOR COUPLING AN INSULATION MONITORING DEVICE TO AN UNGROUNDED POWER SUPPLY SYSTEM

(71) Applicant: Bender GmbH & Co. KG, Gruenberg (DE)

(72) Inventor: Julian Reitz, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 40 days.

(21) Appl. No.: 16/598,074

(22) Filed: Oct. 10, 2019

(65) Prior Publication Data

US 2020/0116778 A1 Apr. 16, 2020

(30) Foreign Application Priority Data

Oct. 10, 2018 (DE) .................... 10 2018 125 004.5

(51) Int. Cl.
*G01R 31/14* (2006.01)
*G01R 31/50* (2020.01)
(Continued)

(52) U.S. Cl.
CPC ............ *G01R 31/14* (2013.01); *G01R 27/18* (2013.01); *G01R 31/1272* (2013.01); *G01R 31/50* (2020.01)

(58) Field of Classification Search
CPC .... G01R 31/14; G01R 31/1272; G01R 31/50; G01R 27/18
See application file for complete search history.

(56) References Cited

U.S. PATENT DOCUMENTS 3,823,370 A 7/1974 Pendleton et al.
4,528,497 A * 7/1985 Arato ................. G01R 31/58
324/509
(Continued)

FOREIGN PATENT DOCUMENTS

CN 1311441 A 9/2001
CN 104977510 A 10/2015
(Continued)

OTHER PUBLICATIONS

English Machine Translation of DE102012222251A1 dated Jun. 5, 2014.

*Primary Examiner* — Patrick Assouad
*Assistant Examiner* — Demetrius R Pretlow
(74) *Attorney, Agent, or Firm* — Dickinson Wright PLLC; Andrew D. Dorisio

(57) ABSTRACT

The invention relates to an electric circuit arrangement and a method for coupling an insulation monitoring device to an ungrounded power supply system via a coupling impedance, which is realized to be operant for each active conductor of the power supply system and which is formed as an ohmic resistance circuit, the ohmic resistance circuit having a settable resistance value which is changeable and a switching-off function for decoupling the insulation monitoring device from the network and being realized as a bidirectional cascade comprising a series circuit of two transistors provided in a mirror-inverted manner, each having a diode connected in parallel, a controlled change in resistance of the transistors for setting the changeable resistance value being effected by a control circuit and the switching-off function for decoupling from the grid being realized by setting a maximum resistance value.

9 Claims, 3 Drawing Sheets

Figure 1:
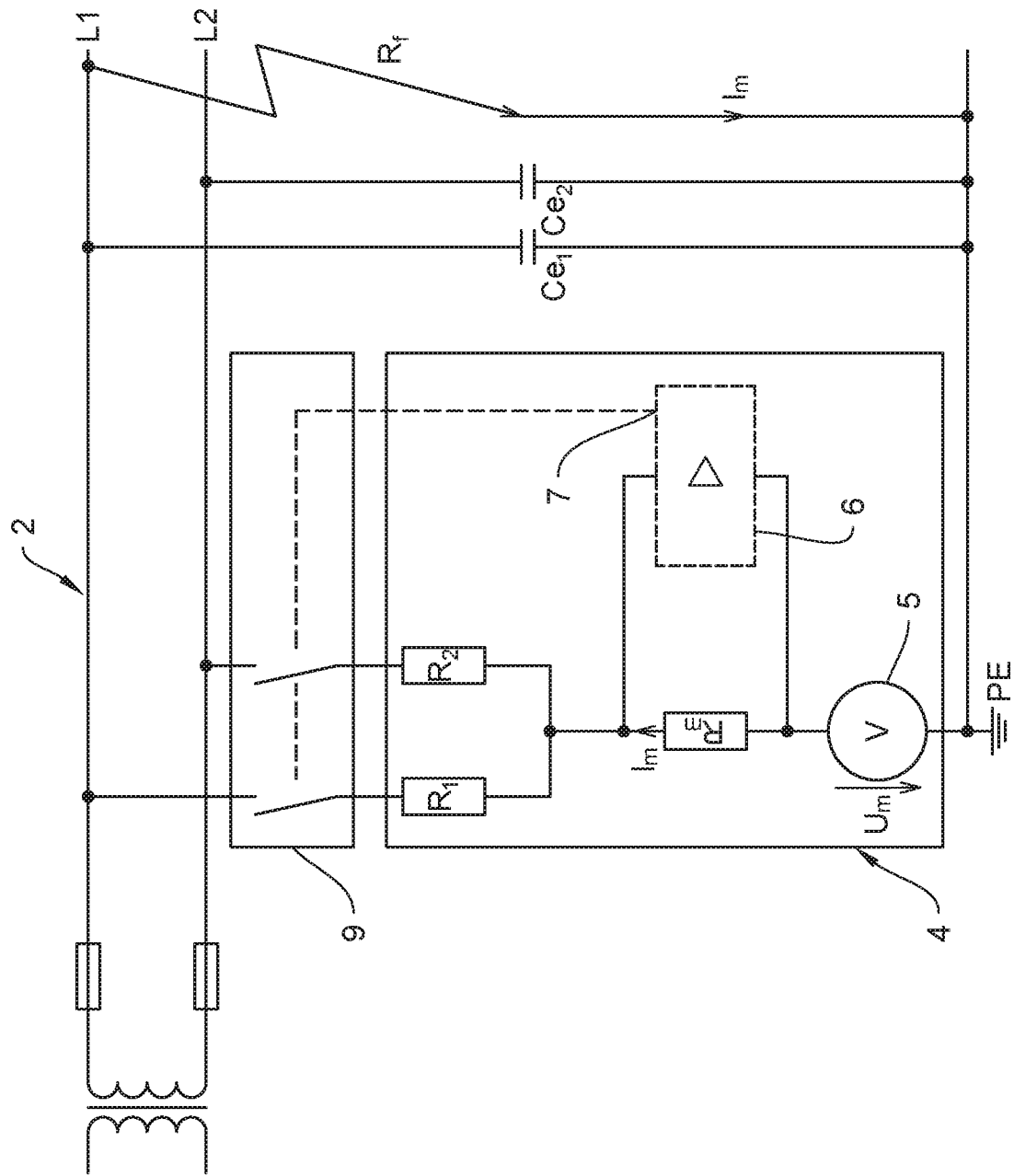

(51) Int. Cl.
*G01R 27/18* (2006.01)
*G01R 31/12* (2020.01)

(56) References Cited

U.S. PATENT DOCUMENTS

| | | | | |
|---|---|---|---|---|
| 5,818,236 A * | 10/1998 | Sone | ........................ | B60L 3/0023 324/509 |
| 7,075,311 B1 * | 7/2006 | Oshiro | ................. | G01R 31/1272 324/557 |
| 2003/0234653 A1* | 12/2003 | Kollenda | ................. | G01R 31/50 324/551 |
| 2007/0001684 A1* | 1/2007 | Kawamura | ........... | G01R 19/2503 324/522 |
| 2008/0309351 A1* | 12/2008 | Stewart | ............... | G01R 31/1272 324/551 |
| 2009/0289640 A1* | 11/2009 | Kawamura | ........... | G01R 27/025 324/658 |
| 2010/0244849 A1* | 9/2010 | Yano | ........................ | G01R 31/50 324/510 |
| 2010/0283539 A1* | 11/2010 | Yanagisawa | ......... | G01R 19/2503 330/127 |
| 2012/0126839 A1* | 5/2012 | Schaefer | ................. | G01R 27/18 324/750.01 |
| 2012/0249070 A1* | 10/2012 | Sellner | ..................... | B60L 53/63 320/109 |
| 2013/0082715 A1* | 4/2013 | Kawamura | ............. | G01R 27/18 324/509 |
| 2013/0088240 A1* | 4/2013 | Hofheinz | ................. | G01R 27/18 324/509 |
| 2013/0099731 A1* | 4/2013 | Schaefer | ................. | H02J 50/90 320/108 |
| 2013/0221997 A1* | 8/2013 | Garcia Alvarrez | .... | G01R 31/14 324/709 |
| 2013/0307338 A1* | 11/2013 | Weiss | ...................... | G01R 27/18 307/64 |
| 2014/0152329 A1* | 6/2014 | Hofheinz | ................. | G01R 1/36 324/691 |
| 2015/0255976 A1* | 9/2015 | Hackl | ..................... | H02H 3/162 361/47 |
| 2015/0285851 A1* | 10/2015 | Kawamura | ........... | B60L 3/0069 324/509 |
| 2015/0293167 A1* | 10/2015 | Kawamura | ........... | B60L 3/0069 324/551 |
| 2016/0216220 A1* | 7/2016 | Eyssler | ................... | G01N 27/04 |
| 2017/0031373 A1* | 2/2017 | Hackl | ..................... | H02H 3/16 |
| 2018/0136284 A1* | 5/2018 | Mayer | .................. | G01R 31/382 |
| 2018/0224494 A1* | 8/2018 | Iwanabe | ................ | G01R 31/64 |
| 2018/0292466 A1* | 10/2018 | Hackl | .................... | G01R 31/1272 |
| 2019/0235013 A1* | 8/2019 | Zhang | ................... | G01R 31/1263 |
| 2019/0310300 A1* | 10/2019 | Kawamura | ........ | H03K 17/6871 |
| 2019/0339314 A1* | 11/2019 | Herber | ................... | G01R 27/18 |
| 2019/0348830 A1* | 11/2019 | Hackl | .................... | G01R 31/58 |
| 2020/0025813 A1* | 1/2020 | Hackl | .................... | G01R 27/02 |
| 2020/0025814 A1* | 1/2020 | Yan | ....................... | G01R 27/025 |
| 2020/0249264 A1* | 8/2020 | Briano | ............... | G01R 31/1263 |

FOREIGN PATENT DOCUMENTS

| | | |
|---|---|---|
| CN | 207164196 U | 3/2018 |
| CN | 108445397 A | 8/2018 |
| DE | 102012222251 A1 | 6/2014 |
| EP | 2664932 A1 | 11/2013 |

* cited by examiner

State of the art

ELECTRIC CIRCUIT ARRANGEMENT AND METHOD FOR COUPLING AN INSULATION MONITORING DEVICE TO AN UNGROUNDED POWER SUPPLY SYSTEM

This application claims the benefit of German Patent Application No. DE 10 2018 125 004.5, filed Oct. 10, 2018, the disclosure of which is incorporated herein by reference.

TECHNICAL FIELD

The invention relates to an electric circuit arrangement and a method for coupling an insulation monitoring device to an ungrounded power supply system via a coupling impedance, which is realized to be operant for each active conductor of the power supply system and which is formed as an ohmic resistance circuit.

BACKGROUND

In contrast to a grounded power supply system, the advantage of an ungrounded power supply system (also referred to as isolated network, French: Isolé Terre—IT power supply system or IT network), in which any and all active parts of the network are isolated from earth, is that the network can continuously be used in case of an insulation fault (first fault) because due to the ideally unlimited impedance value, a closed circuit is unable to form between an active conductor of the network and the earth.

The resistance of the ungrounded power supply system towards earth (insulation resistance—in case of fault also called insulation fault resistance or fault resistance) must therefore be monitored constantly, because a fault loop would be caused by another potential fault at a different active conductor (second fault) and the consequently flowing fault current would result in the installation being disconnected including an operational standstill.

The use of an insulation monitoring device (IMD) according to ICE standard IEC 61557-8 for permanently monitoring insulation resistance is therefore required by law.

The electric connection between the insulation monitoring device and the ungrounded power supply system to be monitored is established during the first operation of the IT network via a coupling impedance, which is fixed, adjusted to the nominal voltage of the IT network and usually integrated in the insulation monitoring device.

Some insulation monitoring devices are additionally equipped with a switching-off function by means of a separating device which causes a decoupling when individual IT networks are interconnected to form a comprehensive network in order to avoid reciprocal interferences between several insulation monitoring devices in coupled networks.

Fixed coupling impedances, meaning that their resistance value is unalterable during operation, have the disadvantage that it is impossible to switch the measurement range of insulation monitoring devices in operation.

Additionally, separating devices must also be integrated in series to the coupling path into the circuit in a disadvantageous manner, and they require a considerable amount of additional space as well as additional expenses due to the high differences in voltage to be overridden.

Up to now, the issue of complying with the different requirements regarding the coupling impedance in view of adjusting it to the power supply system to be monitored has been dealt with by, depending on the area of application, installing special device versions of the insulation monitoring device or of a separate coupling device having coupling impedances, wherein the ohmic resistance circuit of the coupling impedances has different but fixed (constant) resistance values.

According to the state of the art, the switching-off function is realized by a discrete separating device in the form of optocouplers or relays, which are connected in series to the coupling impedance.

SUMMARY

Therefore, the object of the invention is to propose an electric circuit arrangement and a method for coupling an insulation monitoring device to an ungrounded power supply system, which circuitry-wise allow a simple, flexible and cost-effective realization regarding measuring accuracy, electric adjustment and a switching-off function.

This object is attained by designing the ohmic resistance circuit to have a settable resistance value which is changeable and to have a switching-off function for decoupling the insulation monitoring device from the network.

The fundamental concept of the present invention is advantageously based on overcoming the disadvantage of lacking settability and limited flexibility of the coupling impedances known from the state of the art in connection with the effort caused by additional switches by designing this coupling impedance as an ohmic resistance circuit instead of the discrete separating device and the fixed coupling impedance, said ohmic resistance circuit comprising a settable resistance value which is changeable and likewise causes a switching-off function for decoupling the insulation monitoring device from the network.

It is therefore possible to increase the measuring accuracy during operation of the insulation monitoring device when the network characteristics change, for example the insulation deteriorates, because due to the ohmic resistance circuit having a settable resistance value which is changeable, the insulation monitoring device is able to independently adjust to the measuring environment by means of appropriate measurement and control algorithms.

The switching-off function combined with the settable resistance value realizes an integrated separating device without requiring separate switches in the form of optocouplers or relays which would have to be connected in series to a coupling impedance known from the state of the art.

In a further advantageous embodiment, the ohmic resistance circuit is realized as a bidirectional cascade comprising a series circuit of two transistors provided in a mirror-inverted manner, each having a diode connected in parallel, wherein a controlled change in resistance of the transistors for setting the changeable resistance value is effected by a control circuit and the switching-off function for decoupling from the grid is realized by setting a maximum resistance value.

This bidirectional structure can be used in both an alternating current power supply system and in a direct current power supply system and forms the function of an ohmic resistance circuit having a resistance value changeable within the limits of a minimum resistance and a maximum resistance by means of a controlled operating point displacement in the characteristics diagram of the transistors.

The switching-off function is realized by fully controlling the transistors at the maximum resistance value ($R_\infty$) and by merely having a negligible reverse current flow.

In this context, the transistors are controlled by means of a control circuit which specifies a settable target resistance value.

In this context, the control circuit is a functional component of the circuit arrangement according to the invention. Components of the control circuit, such as the controller, can structurally (objectively) be implemented on a microprocessor in the insolation monitoring device.

The control circuit comprises the following advantages: a transformation block, which transforms a settable target resistance value to a target voltage as a reference variable by means of an actual current; a current measurement, which measures a transistor current flowing through the transistor cascade and which supplies said transistor current, scaled as an actual current, back into the transformation block; a comparison element, which compares the target voltage with an actual voltage and forms a differential voltage as a control deviation; a voltage measurement, which measures a transistor voltage dropping across the transistor cascade and which supplies said transistor voltage, scaled as an actual voltage, back into the comparison element; a controller, which generates a manipulated variable from the differential voltage for controlling a controlled section, said manipulated variable being formed by means of the bidirectional transistor cascade having the changeable resistance value as a controlled variable.

The ohmic resistance circuit realized as a bidirectional transistor cascade having the changeable resistance value as a controlled variable forms the controlled section of the control circuit. Within the controlled section, a transistor driver circuit is connected upstream of the bidirectional transistor cascade, said transistor driver circuit being controlled by a manipulated variable which is provided by a controller. The controller in turn generates this manipulated variable from a differential voltage which is being generated in a comparison element. This differential voltage represents the control deviation between a target voltage and an actual voltage, the transistor voltage dropping across the transistor cascade being measured by a voltage measurement and being supplied to the comparison element scaled as an actual voltage and the target voltage as a reference variable of a settable target resistance value being bled off in a transformation block by means of an actual current.

The transistor current flowing through the transistor cascade is measured by a current measurement and supplied to the transformation block scaled as an actual current.

For setting a desired resistance value, the circuit arrangement is merely given a target value of the resistance value. The desired resistance value sets itself independently by means of the current measurement of the transistor current flowing in the transistor cascade performed in the control circuit and by means of the voltage measurement of the transistor voltage dropping across the transistor cascade performed in the control circuit.

Additionally, the control has the advantage of compensating interference impacts acting on the transistors from the surroundings, such as temperature changes.

The controller is preferably designed as a PI controller.

A PI controller which, in addition to its proportional behavior (p proportion) comprises an integral portion, is preferably used in the control circuit and does therefore not cause a permanent control deviation.

A protective resistor for each active conductor is advantageously connected in series to the respective ohmic resistance circuit.

Protective resistors are provided in case of fault of a short-circuited transistor cascade.

In a further embodiment, the electric circuit arrangement is designed as an extension module for the insulation monitoring device or as a separate structural unit.

The circuit arrangement according to the invention can be designed as an integral component of an insulation monitoring device which thereby allows an adjustment of the operating range of the nominal voltage to the nominal voltage of the power supply system to be monitored and which also has the function of a separating device.

Alternatively, the circuit arrangement according to the invention can be designed as a separate structural unit which is connected between the power supply system to be monitored and the insulation monitoring device as a coupling device.

Furthermore, the object of the invention is attained by a method for coupling an insulation monitoring device to an ungrounded power supply system via a coupling impedance, which is realized to be operant for each active conductor of the power supply system and which is formed as an ohmic resistance circuit, wherein a setting of a changeable resistance value of the ohmic resistance circuit is effected and a switching-off function for decoupling the insulation monitoring device form the network can be caused by setting the resistance value.

The previously described electric circuit arrangement according to the invention is based on a method for coupling an insulation monitoring device to an ungrounded power supply system via an ohmic resistance circuit having a changeable resistance value and a switching-off function for decoupling the insulation monitoring device from the network. Therefore, the aforementioned technical effects and the advantages resulting therefrom also apply to the features of the method.

More specifically, the method according to the invention allows an adjustment of the insulation monitoring device to the respectively relevant network conditions by means of a steplessly settable resistance value of the coupling impedance designed as an ohmic resistance circuit and therefore, the settling time for the insulation resistance measurement can be reduced and the measuring accuracy can be increased without having to change the hardware of the insulation monitoring device.

For coupling an insulation monitoring device to an ungrounded power supply system to be monitored, the present invention realizes a steplessly settable coupling impedance on the basis of power semiconductors, which is also combined with the possibility of a switching-off function (network disconnection).

The control circuit allows a minimization of deviations between actual and target resistance values, taking interference impacts into account.

BRIEF DESCRIPTION OF THE DRAWING FIGURES

Figure 2:
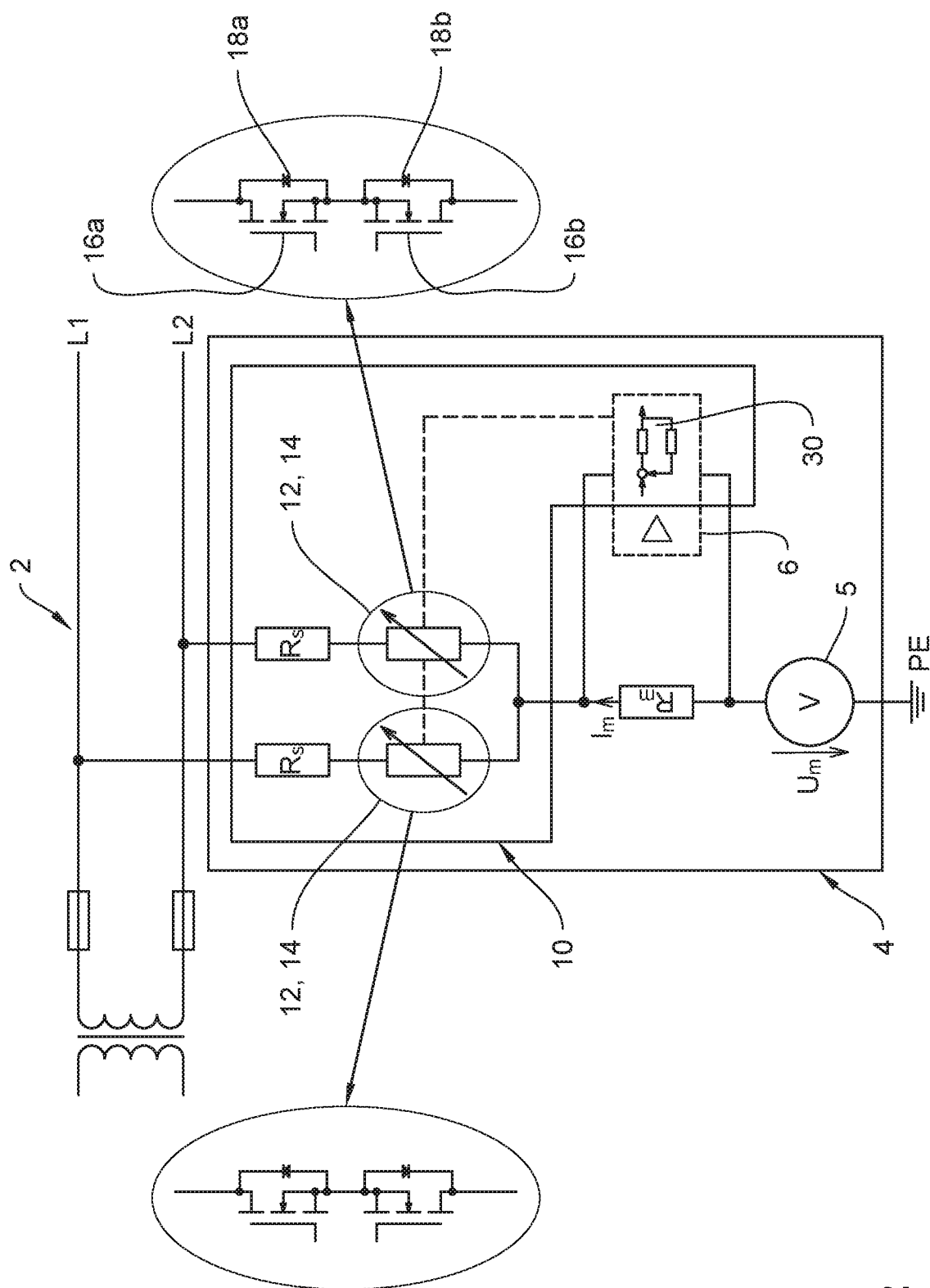
Figure 3:
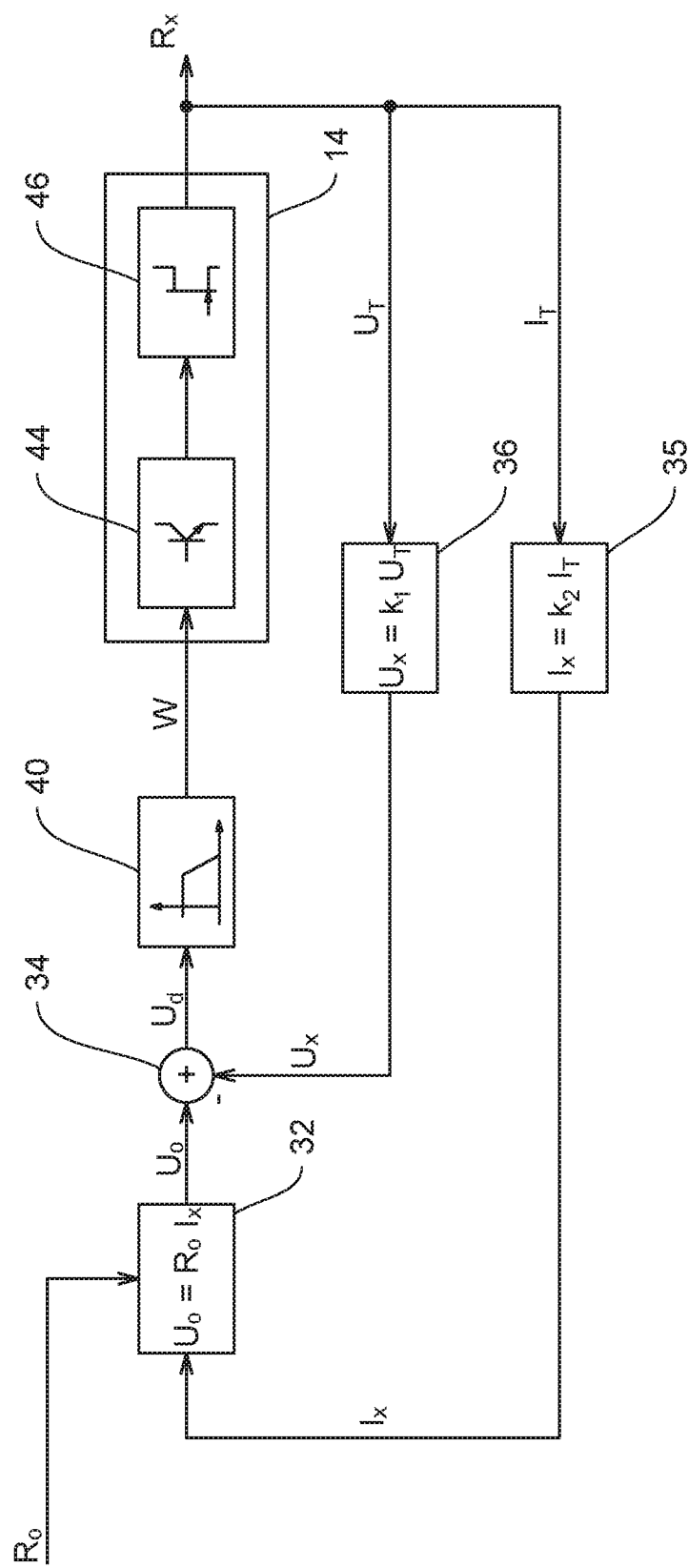

Further advantageous embodiments can be derived from the following description and the drawings, which illustrate a preferred exemplary embodiment of the invention. In the figures:

FIG. 1 an insulation monitoring device according to the state of the art,

FIG. 2 an electric circuit arrangement according to the invention having a coupling impedance comprising a settable resistance value and FIG. 3 a control circuit of the electric circuit arrangement according to the invention.

DETAILED DESCRIPTION

FIG. 1 illustrates an ungrounded power supply system 2 having active conductors ($L_1$, $L_2$) to which an insulation monitoring device 4 is connected in series to a separating device 9 between the active conductors (L$_1$, L$_2$) and protective earth (PE). The ungrounded power supply system 2 is further characterized by the leakage capacitances Ce1, Ce2 in relation to PE and by an insulation resistance R$_f$ in relation to PE to be monitored by the insulation monitoring device 4.

The insulation monitoring device 4 comprises a voltage measuring generator 5 which generates a measuring voltage U$_m$ and superposes it over the ungrounded power supply system 2. The insulation resistance R$_f$ closes the measuring circuit and generates a measuring current I$_m$, which causes a voltage drop at a measuring resistance R$_m$, from which the value of the insulation resistance R$_f$ can be determined by an evaluation device 6.

For controlling the separating device 9, the evaluation device 6 additionally comprises a signal output 7, via which the insulation monitoring can be deactivated.

Furthermore, the resistances R$_1$ and R$_2$ having fixed resistance values are provided as coupling impedances in the insulation monitoring device 4 in order to adjust the operating range of the insulation monitoring device 4 to a network voltage of the ungrounded power supply system 2.

FIG. 2 illustrate an electric circuit arrangement 10 according to the invention having the coupling impedance as an ohmic resistance circuit 12 having a settable resistance value which is changeable.

In contrast to the fixed coupling impedances R$_1$ and R$_2$ known from the state of the art illustrated in FIG. 1, the electric circuit arrangement 10 for coupling the insulation monitoring device 4 as a coupling impedance for each active conductor L$_1$, L$_2$ according to the invention comprises an ohmic resistance circuit 12, which is designed as a bidirectional transistor cascade 14.

The bidirectional transistor cascade 14 comprises a series circuit of two transistors (16a, 16b) provided in a mirror-inverted manner, each having a diode (18a, 18b) connected in parallel. MOSFETs are preferably used as transistors (16a, 16b), a controlled operating point displacement being effected by a MOSFET driver circuit, resulting in the desired resistance value being set in a voltage-controlled manner.

Protective resistors R$_s$ are provided as a protective circuit in case of a short-circuited transistor cascade 14 for current limitation.

The transistor cascade 14 is controlled via a control circuit 30, which is integrated in the evaluation device 6 of the insulation monitoring device 4 in the present invention. In the illustrated embodiment, the electric circuit arrangement 10 for coupling the insulation monitoring device 4 according to the invention is designed as an extension module of the insulation monitoring device 4. An embodiment as a separate structural unit is also possible.

In both embodiments, the electric circuit arrangement 10 according to the invention circuitry-wise represents a simple and cost-effective realization of a coupling for an insulation monitoring device 4 due to the settable resistance value which is changeable having an integrated switching-off function on the basis of semiconductor components.

FIG. 3 illustrates a control circuit 30 of the circuit arrangement according to the invention for coupling the insulation monitoring device 4. Initially, the desired resistance value R$_0$ is specified as an input variable of the control circuit, said resistance value R$_0$ being transformed to a target voltage U$_0$ via a transformation block 32. The transformation is effected by a current measurement 35 which measures the transistor current I$_T$ flowing through the transistor cascade 14 and which supplies said transistor current I$_T$, scaled as an actual current I$_x$, back into the transformation block 32.

A differential voltage U$_d$ is formed from the target voltage U$_0$ and an actual voltage U$_x$ in a comparison element 34, said actual voltage U$_x$ being obtained from the transistor voltage U$_T$ dropping across the transistor cascade 14 by means of a voltage measurement 36.

The transistor current flowing through the transistor cascade is measured by a current measurement and supplied to the transformation block scaled as an actual current.

The differential voltage U$_d$ is supplied to a controller 40, which forms a manipulated variable W for controlling the transistor cascade 14 from said differential voltage U$_d$, said controller 40 preferably being realized as a PI controller.

In addition to the actual transistor (series) circuit 46, the transistor cascade 14 comprises a driver circuit 44 for controlling the transistor circuit 46. The actual resistance value R$_x$ of the transistor cascade 14 approaches the settable target resistance value R$_0$ as a controlled variable.

The invention claimed is:

1. An electric circuit arrangement (10) for coupling an insulation monitoring device (4) to an ungrounded power supply system (2) having a coupling impedance, which is realized to be operant for each active conductor of the power supply system (2) and which is formed as an ohmic resistance circuit (12), wherein the ohmic resistance circuit (12) is designed to have a settable resistance value which is changeable and to have a switching-off function for decoupling the insulation monitoring device (4) from the network and the ohmic resistance circuit (12) is realized as a bidirectional cascade (14) comprising a series circuit of two transistors (16a, 16b) provided in a mirror-inverted manner, each having a diode (18a, 18b) connected in parallel, wherein a controlled change in resistance of the transistors (16a, 16b) for setting the changeable resistance value is effected by a control circuit (30) and the switching-off function for decoupling from a grid is realized by setting a maximum resistance value.

2. The electric circuit arrangement (10) according to claim 1, wherein the control circuit (30) comprises:
   a transformation block (32), which transforms a settable target resistance value (R0) to a target voltage (U0) as a reference variable by means of an actual current (Ix);
   a current measuring instrument (35), which measures a transistor current (IT) flowing through the transistor cascade (14) and which supplies said transistor current (IT), scaled as an actual current (Ix), back into the transformation block (32);
   a comparison element (34), which compares the target voltage (U0) with an actual voltage (Ux) and forms a differential voltage (Ud) as a control deviation;
   a voltage measuring instrument (36), which measures a transistor voltage (UT) dropping across the transistor cascade (14) and which supplies said transistor voltage (UT), scaled as an actual voltage (Ux), back into the comparison element (34);
   a controller (40), which generates a manipulated variable (W) from the differential voltage (Ud) for controlling a controlled section, said manipulated variable (W) being formed by means of the bidirectional transistor cascade (14), having the changeable resistance value as a controlled variable.

3. The electric circuit arrangement (10) according to claim 2, wherein the controller (40) is designed as a PI controller.

4. The electric circuit arrangement (10) according to claim 1, wherein a protective resistor (Rs) for each active conductor (L1, L2), which is connected in series to the respective ohmic resistance circuit (12).

5. The electric circuit arrangement (10) according to claim 1, wherein an embodiment as an extension module for the insulation monitoring device (4) or as a separate structural unit.

6. A method for coupling an insulation monitoring device (4) to an ungrounded power supply system (2) via a coupling impedance, which is realized to be operant for each active conductor of the power supply system (2) and which is formed as an ohmic resistance circuit (12), wherein setting of a changeable resistance value of the ohmic resistance circuit (12), wherein a switching-off function for decoupling the insulation monitoring device from the network is effected by setting the resistance value and the ohmic resistance circuit (12) is realized as a bidirectional cascade (14) comprising a series circuit of two transistors (16a, 16b) provided in a mirror-inverted manner, each having a diode (18a, 18b) connected in parallel, the setting of the changeable resistance value is effected by means of a controlled change in resistance of the transistors (16a, 16b) within a control circuit (30) and the switching-off function for decoupling from the network is realized by setting a maximum resistance value.

7. The method according to claim 6, wherein in the control circuit (30), a settable target resistance value (R0) is transformed to a target voltage (U0) as a reference variable through a transformation block (32) by means of an actual current (Ix);
a transistor current (IT) flowing through the transistor cascade (14) is measured and supplied to the transformation block (32) scaled as an actual current (Ix) by means of a current measuring instrument (35);
the target voltage (U0) is compared with an actual voltage (Ux) in a comparison element (34) and a differential voltage (Ud) is formed as a control deviation;
a transistor voltage (UT) dropping across the transistor cascade (14) is measured and supplied to the comparison element (34) scaled as an actual voltage (Ux) by means of a voltage measuring instrument (36); and
a manipulated variable is generated from the differential voltage (Ud) in a controller, said manipulated variable controlling a controlled section, which is formed from the bidirectional transistor cascade (14), having the changeable resistance value as a controlled variable.

8. The method according to claim 7, wherein a PI controller is implemented as the controller (40).

9. The method according to claim 1, wherein a protective resistor (Rs) for each active conductor (L1, L2) is connected in series to the respective ohmic resistance circuit (12).

* * * * *